US007421779B2

United States Patent
Nakao et al.

(10) Patent No.: US 7,421,779 B2
(45) Date of Patent: Sep. 9, 2008

(54) MULTILAYER BOARD MANUFACTURING METHOD

(75) Inventors: Osamu Nakao, Sakura (JP); Reiji Higuchi, Sakura (JP); Syouji Ito, Sakura (JP); Masahiro Okamoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 180 days.

(21) Appl. No.: 10/545,731

(22) PCT Filed: Feb. 13, 2004

(86) PCT No.: PCT/JP2004/001544

§ 371 (c)(1),
(2), (4) Date: Aug. 15, 2005

(87) PCT Pub. No.: WO2004/073370

PCT Pub. Date: Aug. 26, 2004

(65) Prior Publication Data

US 2006/0191133 A1     Aug. 31, 2006

(30) Foreign Application Priority Data

Feb. 13, 2003     (JP)     ............... 2003-035330

(51) Int. Cl.
*H05K 3/30*     (2006.01)

(52) U.S. Cl. .............. 29/831; 29/829; 29/847; 29/852; 174/255

(58) Field of Classification Search ........... 29/825, 29/829–831, 846–849, 851, 852; 174/255, 174/259, 262; 156/233, 282; 361/748; 428/209
See application file for complete search history.

(56) References Cited

U.S. PATENT DOCUMENTS

| 5,652,042 | A | * | 7/1997 | Kawakita et al. | ............ 428/209 |
| 5,719,354 | A | * | 2/1998 | Jester et al. | ................. 174/255 |
| 5,879,568 | A | * | 3/1999 | Urasaki et al. | ................. 216/18 |
| 5,888,627 | A | * | 3/1999 | Nakatani | ..................... 29/830 |

FOREIGN PATENT DOCUMENTS

JP     06-302957 A     10/1994

(Continued)

OTHER PUBLICATIONS

Kiyoshi Takagi, "Build-up multi-layer printed wiring board technology" published by The Nikkan Kogyo Shinbun, Ltd., Jun. 20, 2001.

*Primary Examiner*—Minh Trinh
*Assistant Examiner*—Donghai D. Nguyen
(74) *Attorney, Agent, or Firm*—Sughre Mion, PLLC

(57) ABSTRACT

A base material (20) is arranged on top of at least one first internal layer base material (10), and a second internal base material (30) is arranged underneath the base material (10). And thereafter a surface layer circuitry conductive foil (40) is arranged underneath the base material (30), and subsequently these materials are colaminated for forming a colaminated body (80). While this colaminating operation, conductive portions being formed in the base materials 10, 30 are aligned to electrically connect one another for forming an internal circuitry. And thereafter, an interlayer conductive portion (51) being electrically connected to the internal circuitry is formed, and a minute circuitry is formed on the top of the base material (20) and the conductive foil (40) accordingly.

6 Claims, 14 Drawing Sheets

FOREIGN PATENT DOCUMENTS

| | | |
|---|---|---|
| JP | 09-082835 A | 3/1997 |
| JP | 09-116273 A | 5/1997 |
| JP | 11-298105 A | 10/1999 |
| JP | 2002-261444 A | 9/2002 |
| JP | 2002-319762 A | 10/2002 |
| JP | 2002-344109 A | 11/2002 |
| JP | 2003-008212 A | 1/2003 |

* cited by examiner

PRIOR ART FIG.1A 
PRIOR ART FIG.1B 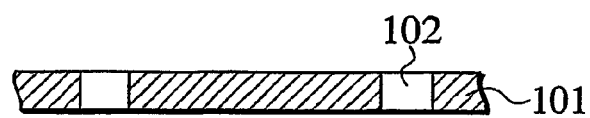
PRIOR ART FIG.1C 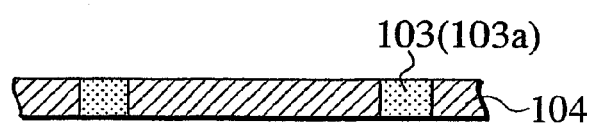
PRIOR ART FIG.1D 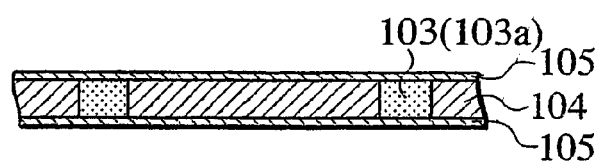
PRIOR ART FIG.1E 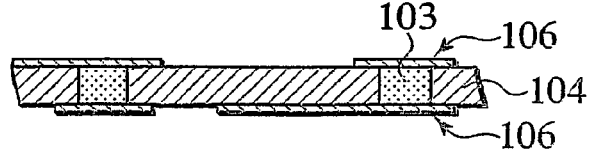
PRIOR ART FIG.1F 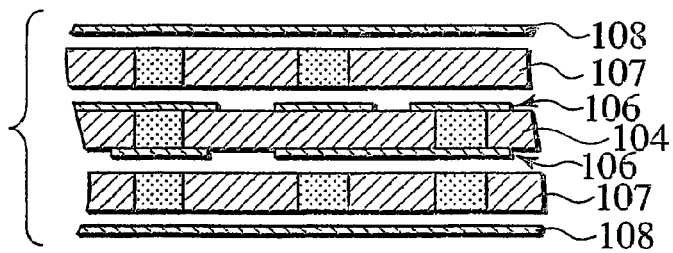
PRIOR ART FIG.1G 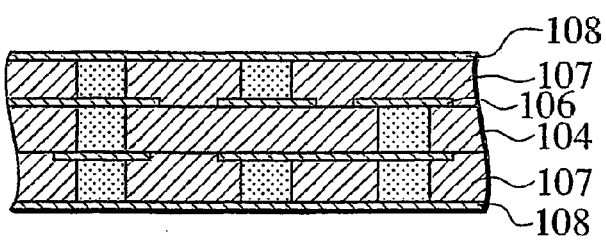
PRIOR ART FIG.1H 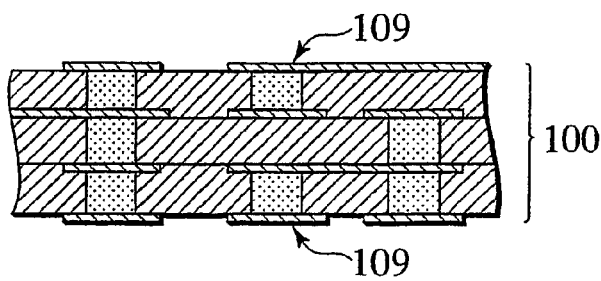

PRIOR ART FIG.2A 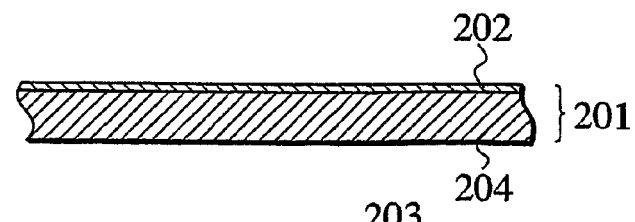
PRIOR ART FIG.2B 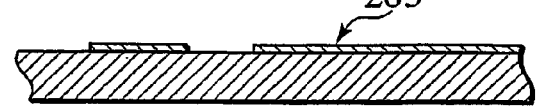
PRIOR ART FIG.2C 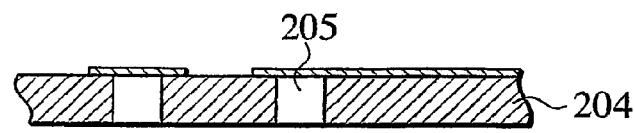
PRIOR ART FIG.2D 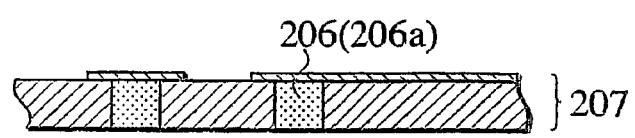
PRIOR ART FIG.2E 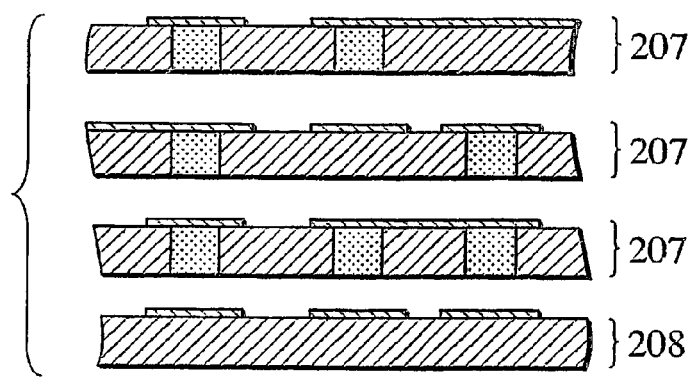
PRIOR ART FIG.2F 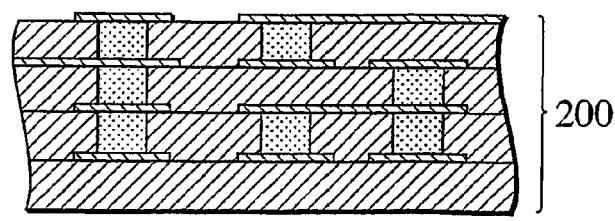

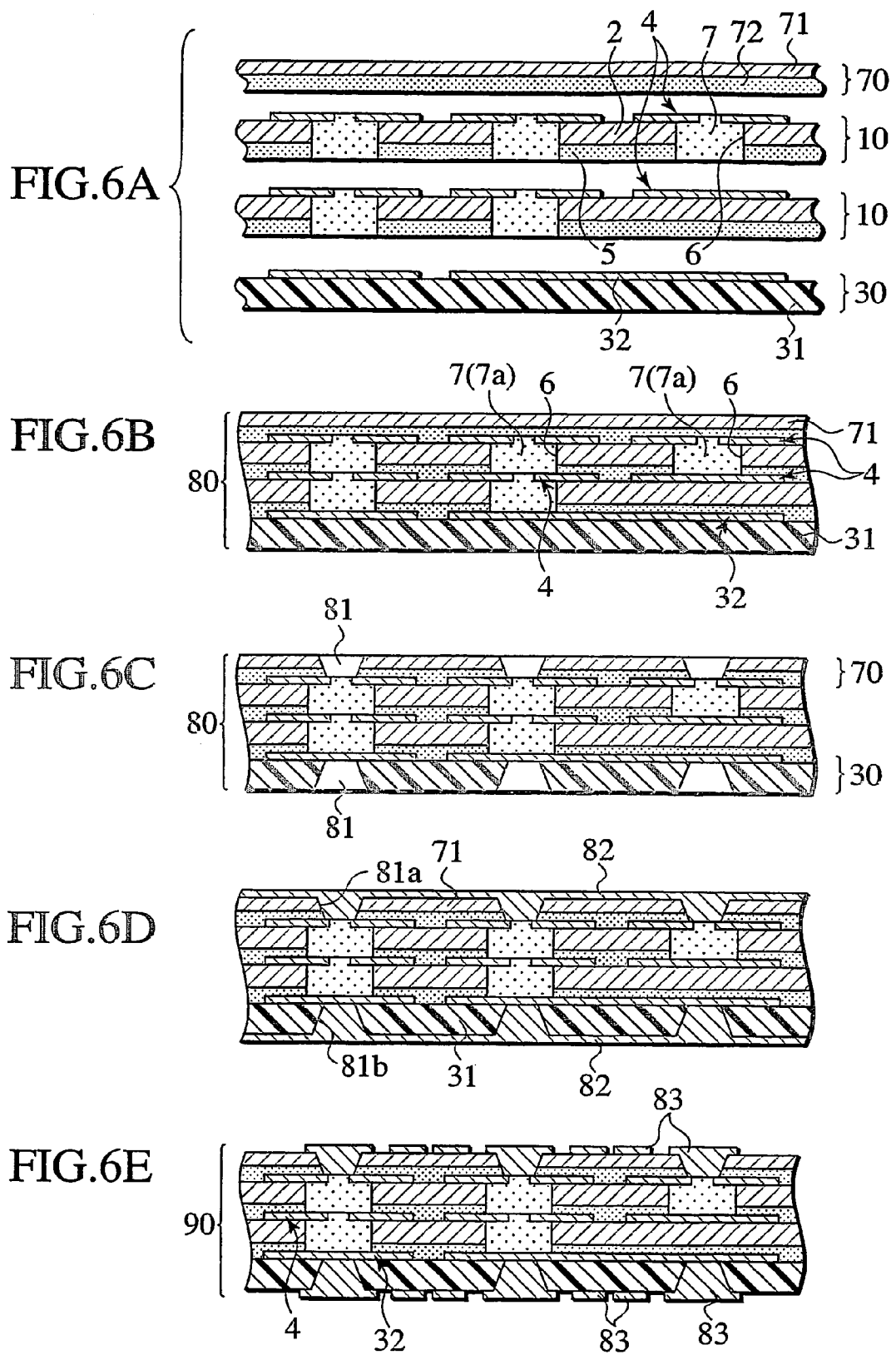

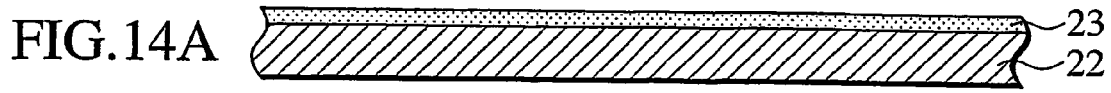
FIG.14A
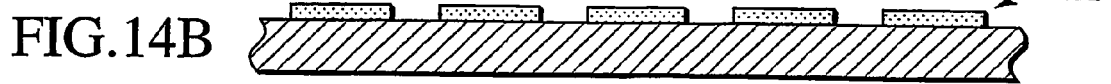
FIG.14B
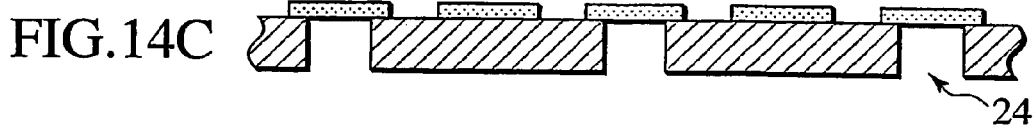
FIG.14C
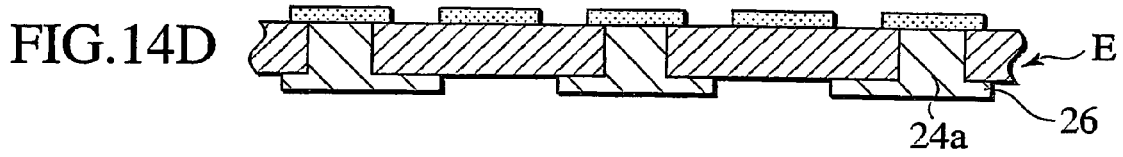
FIG.14D
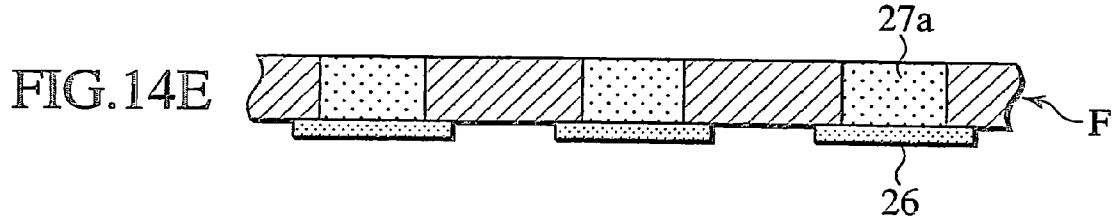
FIG.14E
FIG.14F
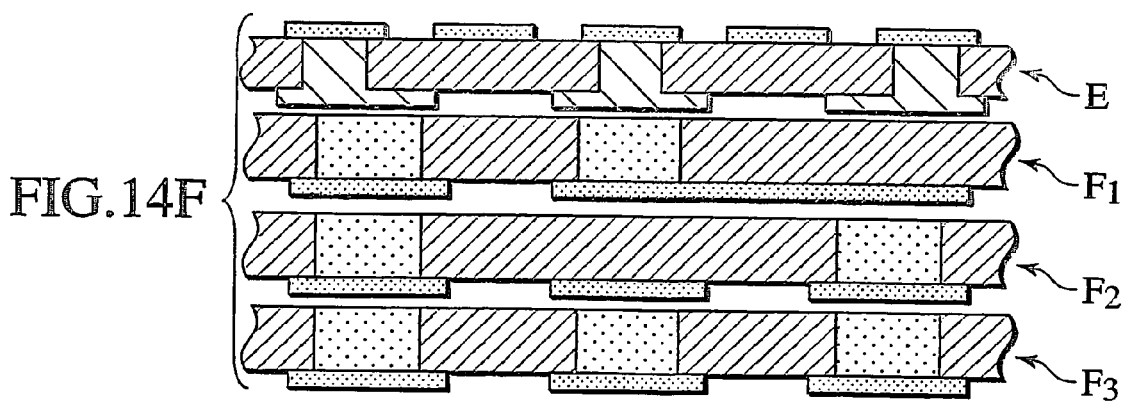
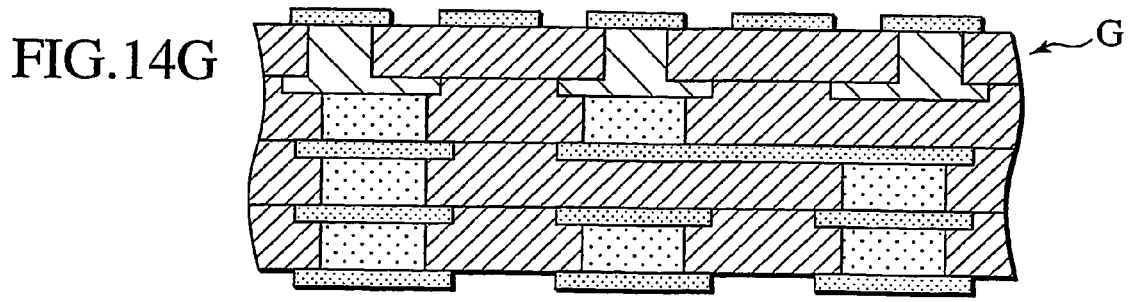
FIG.14G

MULTILAYER BOARD MANUFACTURING METHOD

TECHNICAL FIELD

The present invention relates to multi-layer boards and a method for manufacturing the multi-layer board, and in particular, to a multi-layer board which is used for a package substrate or the like and a method for manufacturing the multi-layer board.

BACKGROUND TECHNOLOGY

Accompanying the compactization of electronic equipment, the miniaturization of semiconductor chips and the parts, and making the terminals have narrow pitches, reduction in packaging area of a printed wiring board (wiring substrate) and making wiring be precise have been progressed. Further, with respect to information-related equipments, to address a broadband signal frequency, there is high demand to make circuits connecting between parts short. Therefore, in order to achieve a high density and high performance, making a printed wiring board multi-layered is an indispensable technique.

With respect to a multi-layer board, a circuitry (interlayer conductive portions) for electrically connecting between layers, which was not in a conventional circuit board, is the key technology. At a multi-layer board base material structuring the respective layers of the multi-layer board, through holes are provided at an insulating layer, and due to conductors being plated along the inner wall surfaces of the through holes, one side surface and the other side surface of the multi-layer wiring base material are electrically connected.

IBM provides an SLC (Surface Laminar Circuitry) which is a representative build-up multi-layer board, and according to a method thereof, a part of the insulating layer of the multi-layer board base material is eliminated by photolithography process by using a photosensitive resin, a laser beam machining, or the like, and interlayer conductive portions for connecting between the layers are formed by plating (for example, "Build-up multi-layer printed wiring board technology" by Kiyoshi Takagi; published by THE NIKKAN KOGYO SHINBUN, LTD.).

Conductive connection of wiring by using plating has the advantage that fine circuitry can be connected so as to be conductive at a low resistance. However, because the manufacturing process is complex, and the man-hour is large, the cost is increased, and it becomes a factor of limiting the uses of a multi-layer board.

In recent years, as a low-priced interlayer connecting method in place of plating, a multi-layer board using a conductive resin which is typical of an ALIVH (Any Layer Interstitial Via Hole) board of MATSUSHITA GROUP or a B2 bit (Buried Bump Interconnection Technology) of TOSHIBA GROUP has been put to practical use, and the uses of the multi-layer board has been started to be rapidly expanded (for example, in Japanese Patent Application Laid-Open No. H6-302957, Japanese Patent Application Laid-Open No. H9-82835, and "Build-up multi-layer printed wiring board technology" by Kiyoshi Takagi: published by THE NIKKAN KOGYO SHINBUN, LTD.).

According to the ALIVH, as shown in FIGS. 1A through 1H, by using an insulating plate 101 made from prepreg as a starting material, and via holes 102 passing through the one side surface and the other side surface of the insulating plate 101 are provided by using a laser, and interlayer conductive portions 103a are formed by filling conductive pastes 103 into the via holes 102 by a printing process. Due to this operation being carried out on desired regions, an insulating base material 104 having the interlayer conductive portions 103a is formed. Further, copper foils 105 are compressively bonded respectively to the one side surface and the other side surface of the insulating base material 104, and desired wiring patterns (copper foil circuitry) 106 are formed by etching. With respect to the one side surface and the other side surface of the insulating base material 104 obtained in this way, insulating base materials 107 having the same structure as the insulating base material 104, and copper foils 108 are respectively compressively bonded. A multi-layer board 100 is formed by a build-up process in which forming of a wiring pattern 109 on the copper foil 108 after the compression bonding is repeated.

Other than the method of the ALIVH, as used in the manufacturing method of the SLC, via holes are can be formed by carrying out exposure and development on an insulating layer a desired number of times by using a photosensitive resin, and a disused resin is eliminated by chemical etching or dry etching can be applied.

The manufacturing method of a multi-layer board which uses conductive paste is in low-priced, and on the other hand, there are some disadvantages that the electrical resistance of the conductive paste is greater than the plating used in the build-up process, the contact resistance with a copper foil circuitry is unstable, and the like. However, those are getting to be gradually solved.

With respect to a wiring board, such as a multi-chip module or the like, into which a bare chip assembled, there is the trend that the thickness of one layer structuring the multi-layer board is reduced accompanying making wiring have high density. Due to this reduction in a layer thickness, as a single insulating film, flexures or wrinkles easily arise, and it is difficult to ensure a dimensional stability.

In consideration of this problem, as the manufacturing method of the multi-layer board using conductive paste for interlayer connection, as shown in FIGS. 2A through 2F, there is a manufacturing method by using a film 201 (a starting material) which has an insulating layer 204 and a copper foil 202 on one side of the insulating layer 204. In accordance with the manufacturing method, a multi-layer board 200 is formed due to a plurality of multi-layer wiring base materials 207 being bonded to each other, and being colaminated one another so that the base materials 207 are fixed to one another. A desired wiring pattern (copper foil circuitry) 203 is formed by etching on the copper foil 202, and via holes 205 are opened at the insulating film layer 204, and interlayer conductive portions 206a are formed by filling conductive pastes 206 into the via holes 205 (however, via holes are not provided at a base material 208 which performs as the bottom layer) (for example, Japanese Patent Application Laid-Open No. 2002-353621). This method is called a colaminating press process.

In accordance with the colaminating press process, a copper clad base material (a film with single-sided copper foil) which is comprised of a resin film performing as an insulating layer and a copper foil being provided on top of the resin film (insulating layer) and which performs as a conductive layer is used as a starting material. Therefore, the rigidity of the film is improved, and a high dimensional accuracy can be maintained.

Moreover, according to the colaminating press process, because internal circuitry is formed before the colaminating operation, the multi-layer board which is manufactured by colaminating press process can be prepared for a shorter time and can be manufactured at a higher yield ratio than a multi-layer board manufactured by the build-up process. However, in order to obtain an accuracy which is the same as the build-up process, because colaminating press process is carried out after the multi-layer board base material structuring the respective layers of the multi-layer board is formed in the colaminating press process, it is necessary to high-precisely align the respective multi-layer board base materials each other.

Heretofore, to position layers with a high degree of accuracy in the colaminating press process, a pin alignment process in which a pin passes through a pinhole being provided at a predetermined portion is used. In accordance with the pin alignment process, to enhance the accuracy of the method, it is important to accuracy process the pinhole, and a clearance between the pinhole and the pin made small. However, there is a limit to such an accuracy of the layer to layer positioning, and as compared with the build-up process, the accuracy is inferior thereto. Therefore, even if a board at which a minute circuitry (a fine printed circuitry) has been formed in advance is prepared, alignment of these boards to make a multi-layer wiring board is difficult. In addition, the minute circuitry means a circuitry, wherein the wiring density of the conductor forming the circuitry is very high.

On the other hand, with respect to the multi-layer board, such as SLC, manufactured by the build-up process, because laminating and formation of a circuitry are repeated in order at one layer by one layer, alignment of the circuitry of the adjacent multi-layer board base material, the via holes, the circuitry at the surfaces depends on an accuracy of alignment when a photolithography is carried out. Generally, in the build-up process, the accuracy of registration is higher than that of the multi-layer board formed by the colaminating in which circuitry which have been laminated in advance are aligned and bonded to each other. Consequently, the build-up process is used for many multi-layer boards to which semiconductor chips are directly bonded thereto. However, in the multi-layering by the build-up process, as described above, the manufacturing process is complex, and the man-hour is large, and it highly costs.

The present invention has been made in order to solve the problems as described above, and an object of the present invention is to provide a multi-layer board in which a minute circuitry is formed at the surface layer and semiconductor elements having a narrow pitch can be mounted without loosing the advantage of colaminating process, and a manufacturing method thereof.

DISCLOSURE OF THE INVENTION

In order to achieve the above-described object, according to a first aspect of the invention, there is provided a manufacturing method of a multi-layer board using at least a first internal layer base material which has a conductive circuitry at one side surface of an insulating layer and which has an interlayer conductive portion for electrically connecting the conductive circuitry and other side surface of the insulating layer, and a second internal layer base material having a conductive circuitry at one side surface of an insulating layer, comprising the step of: colaminating the first internal layer base material and the second internal layer base material so that electrically connecting the interlayer conductive portion of the first internal layer base material and the conductive circuitry of the second internal layer base material one another; forming a second interlayer conductive portion at the insulating layer of the second internal layer base material in order to electrically connect the conductive circuitry formed at the one side surface of the second internal layer base material and the other side surface of the second internal layer base material; and forming a minute circuitry at the other side surface of the second internal layer base material.

Further, in order to achieve the above-described object, according to a second aspect of the invention, there is provided a manufacturing method of a multi-layer board using at least a first internal layer base material having a conductive circuitry formed on one side surface of an insulating layer and which has an interlayer conductive portion for electrically connecting the conductive circuitry and other side surface of the insulating layer, a second internal layer base material having a conductive circuitry formed on one side surface of an insulating layer, and an insulating base material having an insulating layer, the method comprising: putting the insulating base material on the conductive circuitry of the first internal layer base material; arranging the conductive circuitry of the second internal base material beneath the insulating layer of the first internal base material; colaminating the first and second internal layer base materials and the insulating base material; forming a first interlayer conductive portion in the insulating base material which is electrically connects the conductive circuitry of the first internal layer base material to the insulating base material; forming a second interlayer conductive portion in the second internal base material which is electrically connects the conductive circuitry formed at the one side surface of the second internal layer base material and the other side surface of the second internal layer base material; and forming a minute circuitry at least at one surface of a surface of the insulating base material opposite to the first internal layer base material and the other side surface of the second internal layer base material.

Further, in order to achieve the above-described object, according to a third aspect of the invention, there is provided a manufacturing method of a multi-layer board using at least a first internal layer base material which has a conductive circuitry at one side surface of an insulating layer and which has an interlayer conductive portion for electrically connecting the conductive circuitry and other side surface of the insulating layer, and an insulating base material having an insulating layer, the method comprising: putting the insulating base material on the conductive circuitry of the first internal layer base material; colaminating the first internal layer base material and the insulating base material; forming a first interlayer conductive portion in the insulating base material which is electrically connects the conductive circuitry of the first internal layer base material and the insulating base material one another; and forming a minute circuitry at a surface of a surface facing opposite to the first internal layer base material of the surface layer circuit base material.

Further, in order to achieve the above-described object, according to a fourth aspect of the invention, there is provided a manufacturing method of a multi-layer board using at least an internal layer base material which has a circuitry at one side surface of an insulating layer and which has an interlayer conductive portion for electrically connecting the conductive circuitry and other side surface of the insulating layer thereof, and a base material which includes first circuitry on one side of an insulating layer and a second circuitry which is made finer than the first circuitry being and formed on the other surface of the insulating layer, and an interlayer conductive portion which electrically connects the first and second circuitry, the method comprising: colaminating the internal layer base material and the base material so that the first circuitry and the circuitry of the internal layer base material are conducted one another

BRIEF DESCRIPTION OF THE DRAWINGS

FIGS. 1A through 1H are process drawings showing a manufacturing process of a conventional multi-layer board.

FIGS. 2A through 2F are process drawings showing another manufacturing process of the conventional multi-layer board.

FIGS. 3A through 3G are drawings showing a first-half process of a manufacturing method of a multi-layer board of a first embodiment of the present invention.

FIGS. 6A through 6E are process drawings showing a manufacturing method of a multi-layer board relating to a modified example of the first embodiment.

FIGS. 14A through 14G are process drawings showing a modified example of the second embodiment.

BEST MODES FOR IMPLEMENTING THE INVENTION

Embodiments of the present invention will be described in detail with reference to the attached drawings.

First Embodiment

Figure 3A:
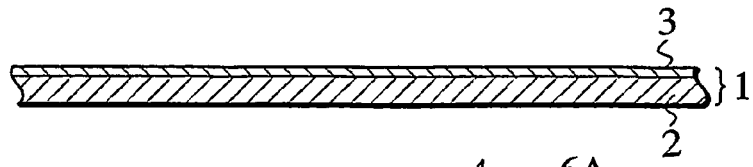
Figure 3D:
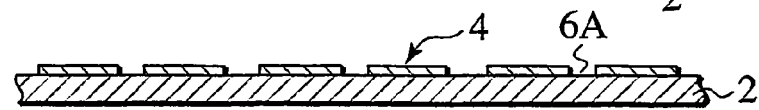

As shown in FIG. 3A, a single-sided copper clad laminate (CCL) 1 having a copper foil 3 on one side surface of a polyimide film 2 (an insulating layer) is used as a starting material. A circuitry pattern (internal layer circuitry) 4 is formed on the copper foil 3 by etching (FIG. 3B). The etching on the copper foil 3 can be carried out by using an aqueous solution whose principal component is ferric chloride and an etchant whose principal component is cupric chloride.

Subsequently, as shown in FIG. 3C, an adhesive layer 5 is formed beneath an adhesive surface side (a surface which is opposite to the copper foil 3) of the polyimide film 2. In a case that a vanish type adhesive layer is used, the adhesive layer 5 is formed by using a roll-coater or a screen-printing machine.

On the other hand, in a case that a film type adhesive layer is used, the adhesive layer 5 is formed by carrying out thermocompression bonding by using a laminator.

In the present embodiment, a polyimide having plasticity is used. As a polyimide material having thermoplasticity, a polyetherimide (PEI) material, a polyether ketone (PEEK) material, or the like can also be used.

Note that the order of the process of forming the internal layer circuitry pattern 4 and the process of forming of the adhesive layer 5 may be reversed. Further, when the insulating layer serves as an adhesive layer as well, the adhesive layer 5 can be omitted. Here, as a material for an insulating layer which can serve as an adhesive layer as well, a polyimide, a thermoplastic polyimide, a thermoplastic polyimide to which a thermoplastic resin is provided, or a liquid crystal polymer can be used.

Subsequently, by irradiating a laser from the side of the adhesive layer 5, via holes 6 that penetrate through the adhesive layer 5 and the polyimide film 2 are provided. A small hole 6A provided at the internal layer circuitry 4 of the copper foil 3, and a center of the via hole 6 are aligned while etching. By this etching, the via hole 6 with a small hole having the small hole 6A whose diameter is smaller than that of the via hole 6 is formed. The diameter of the via hole 6 is, for example, about 100 μm, and the diameter of the small hole 6A is about 30 μm through 50 μm.

Figure 3E:
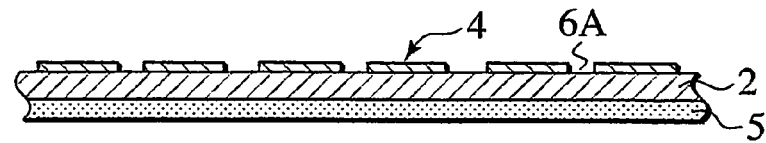

Next, as shown in FIG. 3E, a conductive paste 7 such as a silver paste or the like is filled into all of the via holes 6 and the small holes 6A by squeezing thereof from the side of the adhesive layer 5 by using a squeegee plate which is generally used for screen printing. At the time of filling of the conductive paste 7, a printing mask is not used, and the filling is carried out with the surface of the portions other than the via holes 6 being coated with a thin protective film. By this process, it is possible to suppress a spoilage conductive paste to remain in the holes 6, 6A.

In accordance therewith, a multi-layer board base material (first internal layer base material) 10 for an internal layer circuitry is obtained in which the internal layer circuitry 4 is formed at the one side surface of the insulating layer, and interlayer conductive portions 7a into which the conductive pastes 7 electrically connecting from a one side surface to another side surface are filled are formed. In addition, the upper side of the drawing is defined as the one side surface, and the lower side the drawing is defined as the other side surface.

Figure 3F:
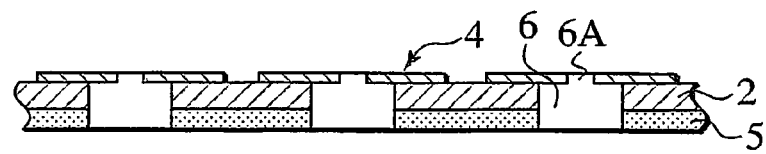

As shown in FIG. 3F, two multi-layer board base materials (first internal layer base materials) 10, 10 for internal layer circuitry, a base material 20 for a surface layer circuitry in which a copper foil (conductive foil) 21 is provided at the one side surface of a polyimide film 22 (an insulating layer), and an adhesive layer 23 is provided at the other side surface thereof (which is equal to a structure in which the conductive foil 21 is pasted on a surface layer circuitry insulating base material 70), a multi-layer board base material (second internal layer base material) 30 for an internal layer circuitry in which a circuitry pattern (circuitry) 32 to be an internal layer circuitry is formed at the one side surface of a polyimide film 31 (an insulating layer), and an adhesive layer 33 is provided at the other side surface thereof, and a conductive foil 40 for a surface layer circuitry are colaminated one another. Note that, in the present embodiment, the example is shown in which the two first internal layer base materials 10 are used. However, the example can be appropriately changed.

In other words, the multi-layer board base material for the surface layer circuitry (surface layer circuitry base material) 20 is disposed at the one surface side (internal layer circuitry 4 side) of the two multi-layer board base materials (first internal layer base materials) 10, 10 for internal layer circuitry, and the multi-layer board base material (second internal layer base material) 30 for an internal layer circuitry is disposed at the other surface side of the two multi-layer board base materials 10 for internal layer circuitry, i.e., at the adhesive layer 5 side of the first internal layer base material 10, and the conductive foil 40 is disposed beneath the multi-layer board base material 30, i.e., at the adhesive layer 33 side, and after these members are aligned accordingly, all of those are colaminated and fixed to each other.

Meanwhile, the multi-layer board base material (second internal layer base material) 30 for an internal layer circuitry has the same configuration as the multi-layer board base material (first internal layer base material) 10 at which the via holes 6 (interlayer conductive portions 7a) are not formed. Furthermore, the multi-layer board base material (surface layer circuitry base material) 20 for a surface layer circuitry corresponds to the CCL at which the adhesive layer 23 is provided.

Moreover, prior to colaminating process, the pin alignment process is carried out so that the internal layer circuitry 4 and 32 are electrically connected to one another via the interlayer conductive portions 7, and thereafter the layers 10, 20, 30 and 40 are colaminated one another by thermal pressing.

Figure 3G:
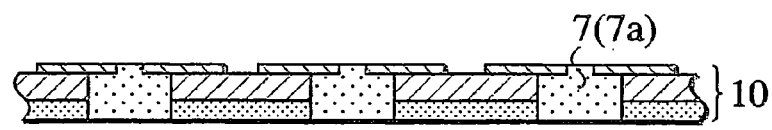

Thus, as shown in FIG. 3G a colaminated board 50 is formed in which the internal circuitry patterns (internal circuitry) 4 and 32 are electrically connected by the interlayer conductive portions 7a formed from the conductive pastes 7 which is filled into the via holes 6. And the board 50 comprises a surface copper foil 21 at which the via holes 6 are not formed, and a back surface copper foil 40 at the other side surface of the board 50.

Figure 4A:
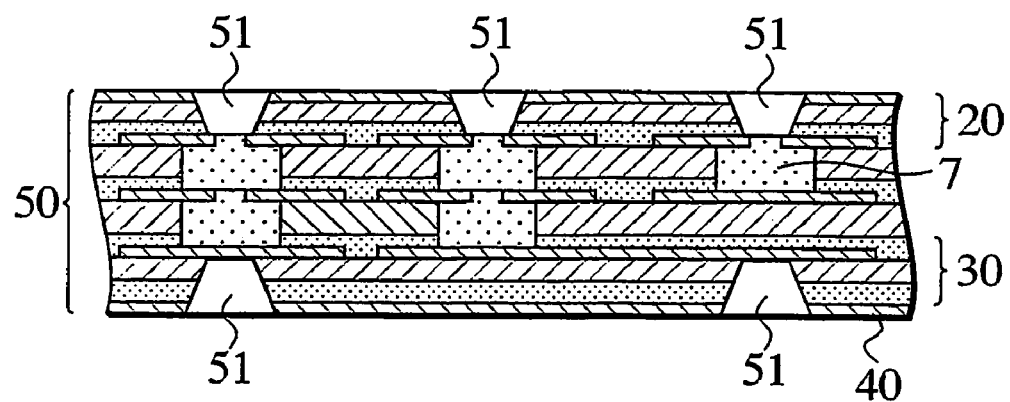
FIGS. 4A through 4C are drawings showing a latter-half process of the manufacturing method of the multi-layer board of the first embodiment of the present invention.

After the colaminating process, via and a minute circuitry (a fine printed circuitry) are formed at the one side surface and the other side of the colaminated board 50. First, by using a laser, as shown in FIG. 4A, via holes 51 for connecting the minute circuitry and the internal layer circuitry which are formed at the one side surface and the other side surface of the colaminated board 50 are respectively formed at the surface layer circuitry base material 20 (the top layer), the second internal layer base material 30 (the bottom layer), and the copper foil 40. In the following embodiments, the minute circuitry means a circuitry, wherein the wiring density of the conductor forming the circuitry is very high.

Note that the alignment of the holes formed by laser beam machining and the layers directly beneath the holes is carried out with X-rays. Namely, while positioning the via holes 51 for connecting the minute circuitry and the internal layer circuitry which are formed at the one side surface and the other side surface of the colaminated board 50, the positions of circuitry are seen through by X-rays.

By using a YAG laser, an excimer laser, and a carbon dioxide laser, a chemical etching by using a resist or a copper foil as a mask and a dry etching, the via holes 51 also can be made.

As shown in FIG. 4, the surface processing is carried out on the inner walls of the via holes 51, before the inner walls of the via holes 51 are coated with copper plating 52. The copper foil 21 and the copper foil 40, and the circuitry pattern (internal layer circuitry) 4 or 32 which is directly beneath the copper foils are respectively electrically connected one another. In accordance therewith, first and second surface layer interlayer conductive portions 51a and 51b connecting the circuitry and the internal layer circuitry which are provided at the one side surface and the other side surface of the colaminated board 50 are formed.

Figure 4B:
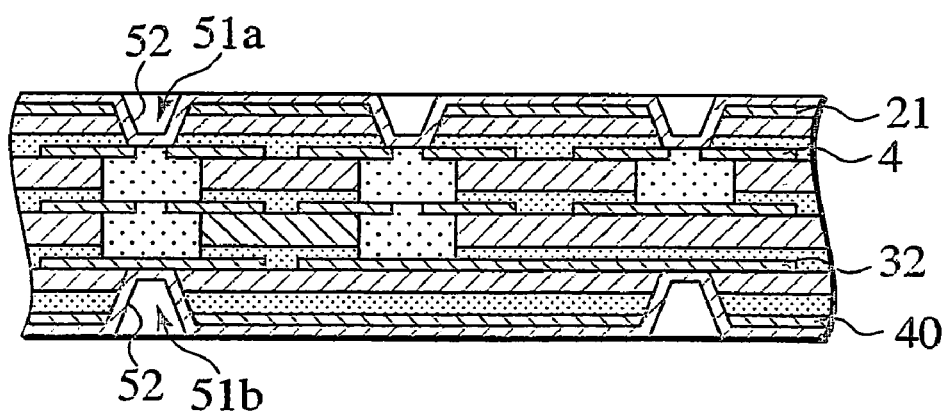
Figure 4C:
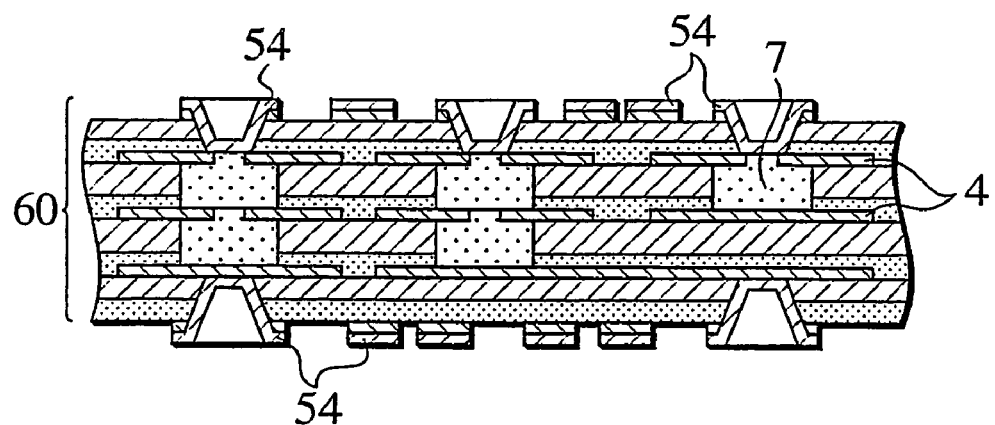

Photoresists are applied on the copper foils 21 and 40. The circuitry pattern (internal layer circuitry) 4 or 32 and the copper foil 21 are positioned accordingly, and thereafter exposure and development are carried out. As the positioning, the positioning process is carried out with X-rays. Further, after etching is carried on the copper foils by using a ferric chloride aqueous solution, and the resists are peeled, and as shown in FIG. 4C, minute circuitry 54 are formed at the both surfaces of the colaminated board 50. Meanwhile, solder resist films are formed so as to cover thereon as needed, a multi-layer board 60 relating to the present embodiment is obtained.

At the multi-layer board 60, the accuracy of positioning of the internal layer circuitry 4 and 32, the via holes 6, and the minute circuitry 54 is equal to the accuracy of an aligner to be used for exposing a pattern for forming the minute circuitry 54, and is extremely higher than the accuracy of the layer to layer positioning by the conventional colaminating process. Therefore, at the minute circuitry relating to the present embodiment, the lands around the vias can be reduced according to the accuracy thereof, the precise-miniaturization of the circuitry can be achieved. For example, the diameters of the lands of the internal layer circuitry 4 and 32 are about 400 µm through 600 µm, and the diameter of the land of the minute circuitry 54 is about 50 µm through 70 µm.

In a case that the one side of a semiconductor interposer is connected to a semiconductor chip, and the opposite side thereof is connected to a printed wiring board of the equipment, a highly precise pattern is required for only the one side surface. In such a case, as shown in FIG. 5, the first internal layer base material 10 (including the internal layer circuitry 4 and the via holes 6), the second internal layer base material 30 (including the internal layer circuitry 32), and the copper foil 40 are colaminated one another, and thereafter the second conductive portions 51b connecting the conductive circuitry and the internal layer circuitry to which a semiconductor chip is connected, and the minute circuitry 54 are formed.

Figure 5:
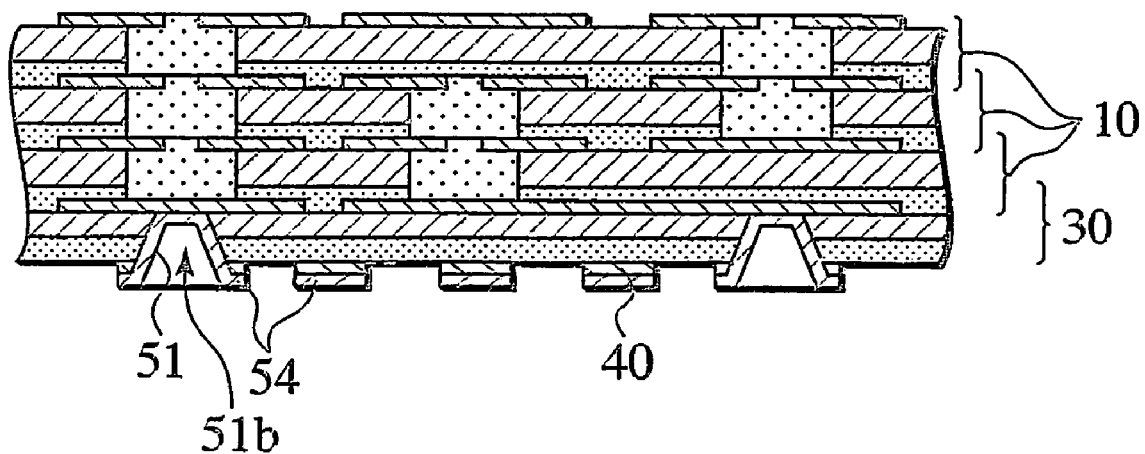
FIG. 5 is a drawing showing a case in which a minute circuitry is formed at only one surface of the surface layer.

Note that the insulting layers of the respective layers used in FIGS. 4C and 5 are preferably structured from the same materials. Thus, a warp of the multi-layer board after colaminating can be suppressed. Further, the effect due to the same materials being used for the respective insulating layers is even greater in a case in which the minute circuitry is formed at only one side surface as shown in FIG. 5. Further, two first internal layer base materials 10 are used in the embodiment shown in FIGS. 4C and 5. However, in a case where three or more first internal layer base materials 10 are used, the same effect can be obtained.

FIGS. 6A through 6E show another modified example of the above-described first embodiment. Note that, in FIGS. 6A through 6E, portions corresponding to the portions in FIGS. 3A through 3C; and FIGS. 4A through 4C are denoted by reference numerals which are the same reference numerals denoted to those of FIGS. 3A through 3G and FIGS. 4A through 4C, and descriptions thereof are omitted.

As shown in FIG. 6A, the two multi-layer board base materials (first internal layer base materials) 10 for internal layer circuitry, the one multi-layer board base material (surface circuitry insulating base material) 70 for a surface layer circuitry which has an adhesive layer 72 at the one side surface of the polyimide film 71 (an insulating layer), and the one multi-layer board base material (second internal layer base material) 30 for an internal layer circuitry are colaminated and fixed to each other. Note that, in the present embodiment, an insulating layer having no adhesive layer is used as the insulating layer of the second internal layer base material.

That is, the multi-layer board base material (surface layer circuitry insulating base material) 70 is arranged on top of the internal layer circuitry 4 of one of the multi-layer board base materials (first internal layer circuitry base material) 10, and the multi-layer board base materials (second internal layer base materials) 30 is arranged beneath the other surface side (adhesive layer 5 side) of another multi-layer circuitry base material (first internal layer circuitry base material) 10, and thereafter those materials are colaminated one another.

As described above, the respective base materials, i.e., the first internal layer base materials 10, the second internal layer base material 30, and the surface layer circuitry insulating base material 70 are positioned such that the internal layer circuitry 4 and 32 are electrically connected one another via the interlayer conductive portions 7*a* by a pin alignment process or the like, and are colaminated by thermal pressing. In accordance therewith, as shown in FIG. 6B, the internal circuitry patterns (internal circuitry) 4 and 32 are connected so as to be conductive between the layers by the interlayer conductive portions 7*a* formed from the conductive pastes 7 which were filled into the via holes 6, and the colaminated body 80 having, at the one side surface and the other side surface thereof, insulating layers (polyimide films 71, 31) at which interlayer conductive portions and minute circuitry are not formed is completed.

After the colaminating, the interlayer conductive portions and the minute circuitry are formed at the one side surface and the other side surface of the colaminated body 80.

As shown in FIG. 6C, by using a laser, via holes 81 for connecting the minute circuitry and the internal layer circuitry which are formed at the one side surface and the other side surface of the colaminated body 80 are respectively formed at he surface layer circuitry insulating base material 70 and the second internal layer base material 30. The positioning of the holes which is formed by laser beam machining and the layers directly beneath thereof is made to match by using X-rays. Namely, positioning of the via holes 81 for connecting the minute circuitry and the internal layer circuitry which are formed at the one side surface and the other side is carried out by seeing through the internal layer circuitry (circuitry pattern 4 or 32) by using X-rays. Note that, provided that the second internal layer base material 30 and the surface layer circuitry insulating base material 70 are made from a material having light transmittance state, the positioning can be carried out by an image processing method.

Next, thin film layers formed two layers of Cu with Ni being made to be an undercoat are formed to be films by sputtering at the surfaces of the insulating layers at the one side surface and the other sides surface of the colaminated body 80 including the inner walls of the via holes 81.

Note that, in addition to Ni, Cr or Ti, or an alloy including those can be used.

Copper plating is carried out by using the spattered layer as a seed layer, and as shown in FIG. 6D, copper layers 82 are formed at the surface of the insulating layers and in the via holes 81. Generally, a plated film is formed so as to have a uniform thickness. However, the copper is selectively deposited in the via holes 81 by via-filling plating in which a plating speed at shallow portion is faster than a plating speed at deep portion, or the like, and the surface after plating can be made to be smooth. In the present embodiment, the latter example is shown. In accordance therewith, the via holes 81 connecting the surface layer and the internal layer are filled with copper plating (copper layers 82), and first and second surface layer interlayer conductive portions 81*a* and 81*b* are formed.

After the copper layers 82 are formed by plating, the disused part thereof is eliminated by etching, and as shown in FIG. 6E, surface layer circuitry (minute circuitry) 83 are formed. Moreover, after solder resist films are formed so as to coat as needed, a multi-layer board 90 is obtained. Note that, as can be understood from FIG. 6E, the pitches between the internal layer circuitry 4 are greater than the pitches of the minute circuitry 83.

At the multi-layer board 90, the accuracy of positioning of the internal layer circuitry 4 and 32, the surface layer interlayer conductive portions 81*a*, and the minute circuitry 83 is equal to the accuracy of an aligner of the etching patterns forming the minute circuitry 83. And therefore, the accuracy of the board 90 is also extremely higher than the accuracy of the layer to layer registration by the conventional colaminating. Furthermore, at the top (uppermost) surface layer, lands around the surface layer interlayer conductive portions 81*a* can be reduced according to the accuracy thereof, and a circuitry which is more precise than that of the related art can be formed.

The manufacturing method described above shows a working example due to a subtractive process. However, an additive process in which the surfaces of the insulating layers are coated with resists with the circuitry patterned portions being made to remain, and plated films are made to grow at only the via holes and the circuitry portions may be used.

Hereinafter, a working example due to the additive process will be described with reference to FIGS. 7A through 7C.

Figure 7A:
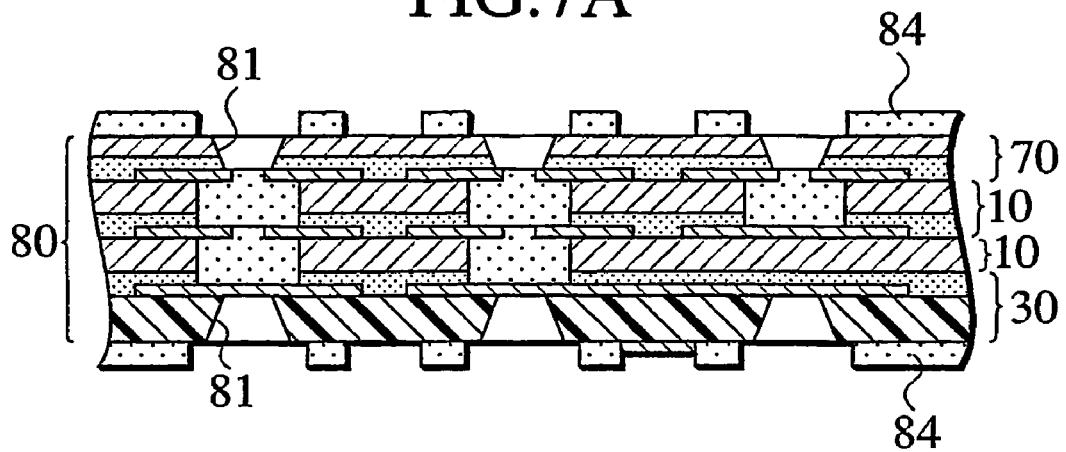
FIGS. 7A through 7C are process drawings showing another example of the manufacturing method of a modified example of the first embodiment.
Figure 7B:
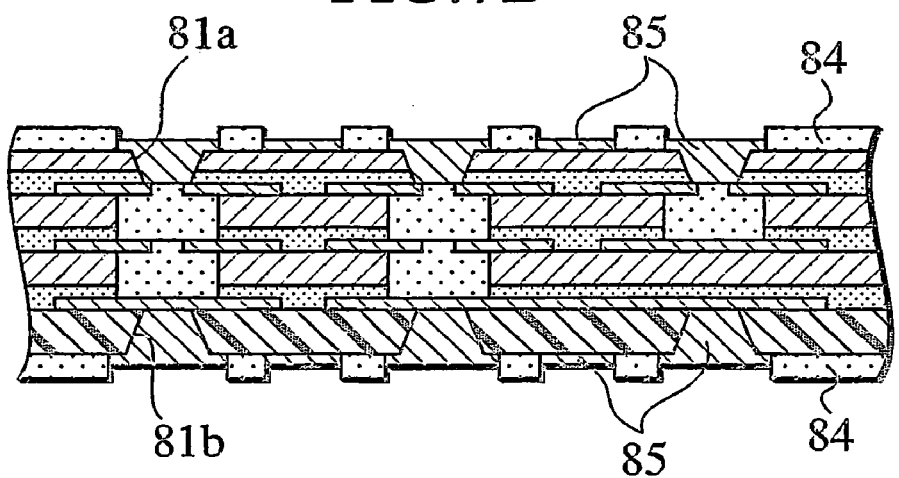

As shown in FIG. 7A, the via holes 81 for connecting the minute circuitry and the internal layer circuitry which are formed at the one side surface and the other side surface of the colaminated body 80 are respectively formed at the surface layer circuitry base material 70 and the second internal layer base material 30 from the one side surface and the other side surface of the colaminated body 80, and after Ni and Cu are formed to be films on the surface of the insulating layers at the one side surface and the other side surface of the colaminated body 80 including the inner walls of the via holes 81 by a sputtering process, resists 84 are stuck on the sputtered films, and exposure and development are carried out thereon. At that time, the patterns which are obtained by the exposure and development are made to be fine.

Subsequently, copper circuitry 85 are formed by electrolytic plating while supplying electric power through the sputtered films. In this case, the insides of the via holes 81 for connecting the minute circuitry and the internal circuitry are filled with copper plating, and the first and second surface layer interlayer conductive portions 81*a* and 81*b* are formed (FIG. 7B). After the plating process, the resists 84 are eliminated, and the sputtered films except for the circuitry are eliminated by etching. In accordance therewith, the multi-layer board 90 which is the same as that of FIG. 6E is formed (FIG. 7C).

Figure 8:
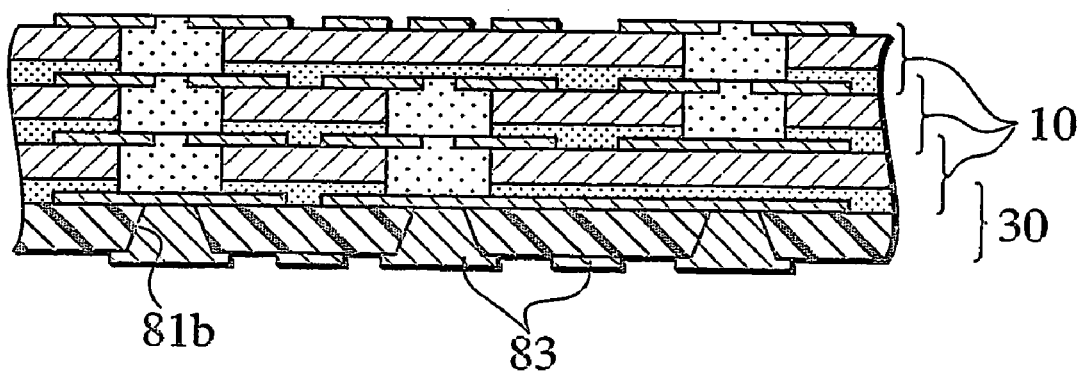
FIG. 8 is a drawing showing a case in which a minute circuitry is formed at only one surface of the surface layer.

In the modified example of the above-described first embodiment as well, when the minute circuitry is formed at only one side surface, as shown in FIG. 8, it suffices that the first internal layer base material 10 at which the circuitry and the via holes (interlayer conductive portions) have already been formed, and the second internal layer base material 30 at which the circuitry has already been formed are colaminated, and the via holes 81 for connecting the minute circuitry and the internal layer circuitry are formed at the second internal layer base material 30 after colaminating and the formation of the minute circuitry 83 by copper plating and the formation of the second surface layer interlayer conductive portions 81*b* are carried out.

Figure 7C:
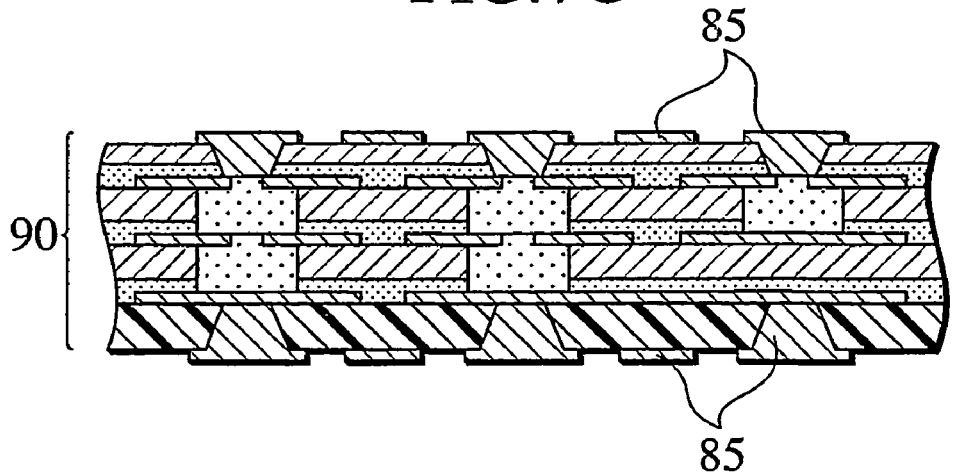

Note that the insulating layers of the respective layers used in FIGS. 7C and 8 are preferably structured from the same materials. Due to the same materials being used for the respective insulating layers, a warp of the multi-layer board after the colaminating can be suppressed. Further, the effect due to the same materials being used for the respective insulating layers is even greater in a case in which the minute circuitry is formed at only one side surface as shown in FIG. 8. Further, the two first internal layer base materials 10 are used in the embodiment shown in FIGS. 7C and 8. However, three or more first internal layer base materials 10 can also be used, and the same effect can be obtained.

Note that, in the present embodiment, the copper clad laminate having the insulating layers and the adhesive layers at the respective base materials is shown. However, in the case in which the insulating layer serves as an adhesive layer as described above, the adhesive layer 5 can be omitted. Note that, as a material for an insulating layer which can serve as an adhesive layer as well, a polyimide, a thermoplastic polyimide, a thermoplastic polyimide to which a thermoplastic resin is provided, or a liquid crystal polymer can be used.

Second Embodiment

Hereinafter, a method for manufacturing a multi-layer board relating to a second embodiment of the present invention will be described with reference to the drawings.

Figure 9A:
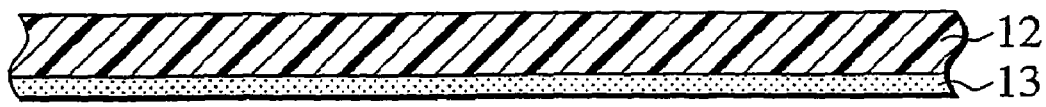
FIGS. 9A through 9H are process drawings showing a manufacturing method of a multi-layer board of a second embodiment of the present invention.
Figure 9B:
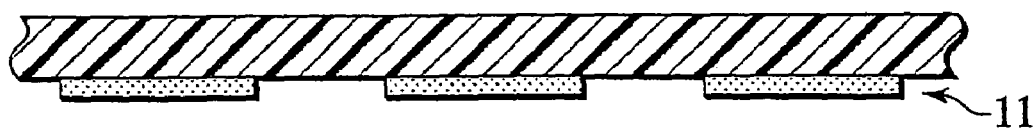

By using a single-sided copper clad laminate (CCL: Copper Clad Laminate) with a copper foil 13 (starting material) being provided on the surface of an insulating layer 12 (an adhesive layer) (see FIG. 9A), copper circuitry and copper land portions 11 are formed at the copper foil 13 by using etching or the like (FIG. 9B). As the single-sided CCL, for example, a polyimide, a thermoplastic polyimide, a thermosetting polyimide, a thermoplastic polyimide to which a thermosetting function is provided, or a liquid crystal polymer are preferably used for an insulating resin layer. In addition thereto, the thickness of the insulating layer is preferably about 10 µm through 70 µm, and the thickness of the copper foil is preferably about 5 µm through 20 µm (1A operation).

Figure 9C:

Subsequently, via holes 14 for electrically connecting the copper circuitry and copper land portions 11 are formed at the insulating layer 12 by laser beam machining, etching, or the like (FIG. 9C) (2A operation). The diameter of the via hole is preferably about 20 µm through 50 µm.

Figure 9D:
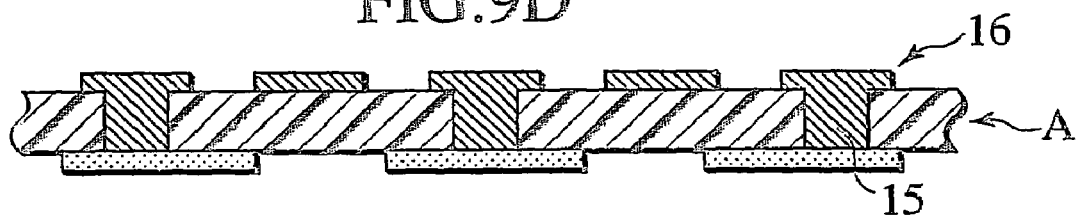
Figure 10A:
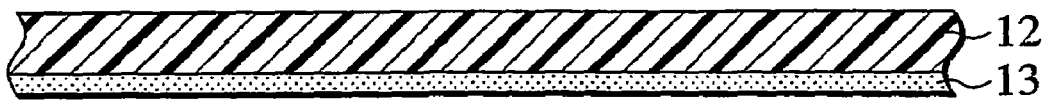
FIGS. 10A through 10D are process drawings showing another manufacturing method of the multi-layer board according to the second embodiment of the present invention.
Figure 10B:
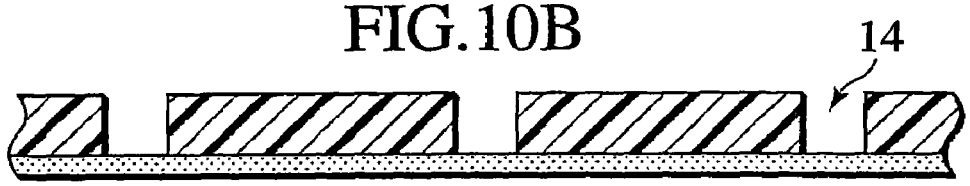
Figure 10C:
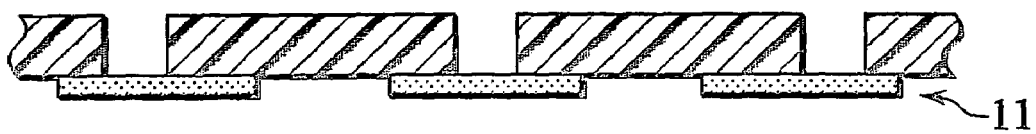
Figure 10D:
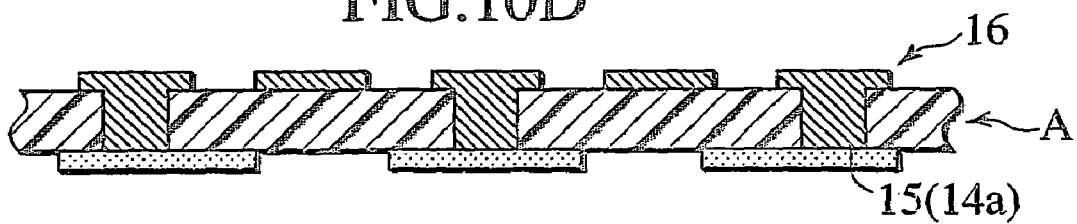

Third surface layer circuitry interlayer conductive portions 15 (hereinafter referred as the third conductive portion 15) are formed by filling conductor by plating or the like at the insides of the via holes 14 which were prepared at the 1A operation, and copper circuitry portion and copper land portions 16 are formed at the surface of the insulating layer 12 (FIG. 9D). Through this operation, a third surface layer circuitry base material A is formed. In addition, FIGS. 10A through 10D show another order of the process for forming the third surface layer circuitry base material A. It is possible to form the base material A in this order. Namely, as shown in FIG. 10A, by using the single-sided copper clad laminate CCL as a starting material, via holes 14 are provided by laser beam machining, etching, or the like (FIG. 10B), subsequently, by carrying out plating after the copper circuitry and copper land portions 11 are formed at the positions corresponding to the via holes 14 of the copper foil 13 (FIG. 10C), and thereafter the third surface layer circuitry base material A is formed (FIG. 10D). At the third surface layer circuitry base material A, a rough circuitry which is coarser than the minute circuitry formed at the one side surface thereof is formed at the other side surface. The accuracy of the rough circuitry formed is set to be within the tolerance required for the colaminating.

Figure 11A:
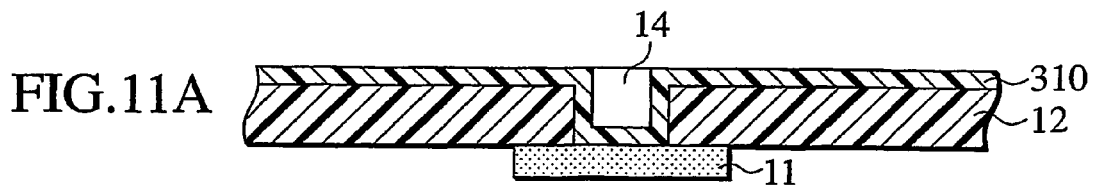
FIGS. 11A through 11D are process drawings showing a first example of a plating technique of the second embodiment.
Figure 11B:
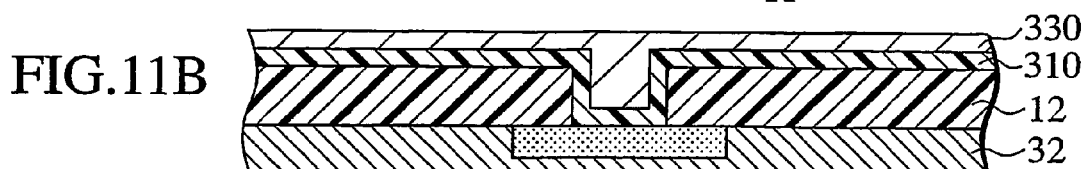
Figure 11C:
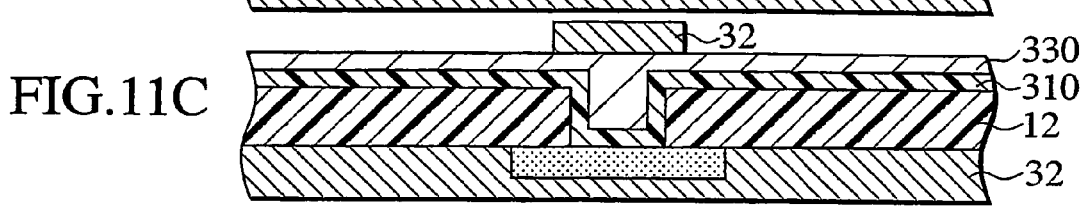
Figure 11D:
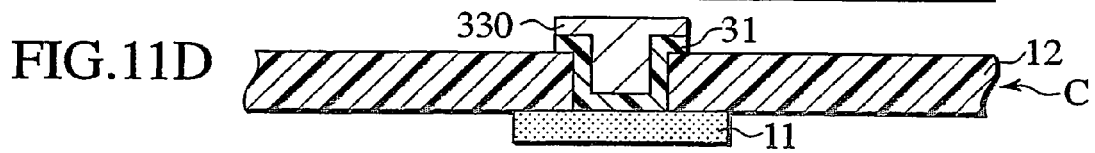

FIGS. 11A through 11D show an example of plating. For example, at the base material in which the via hole 14 is provided on the insulating layer 12, and the copper land portion 11 is provided at the position corresponding to the via hole 14, a plated seed layer 31 is formed at the surface opposite to the copper land portion 11 and at the inside of the via hole 14 by, for example, sputtering, making a catalyst be adsorbed, or the like (FIG. 11A). After a resist 32 is formed for coating the copper land portion 11, a copper 330 is deposited by electrolytic plating (FIG. 11B). Subsequently, the resist 32 is formed so as to be a desired circuitry pattern on the copper 330 deposited by plating (FIG. 11C), and the copper 330 and the seed layer 310 at the region which are not used for the circuitry pattern are eliminated. By these processes, a base material (third surface layer circuitry base material) C in which copper has been filled at the inside of the via hole 14 by plating is formed (FIG. 11D).

Figure 12A:
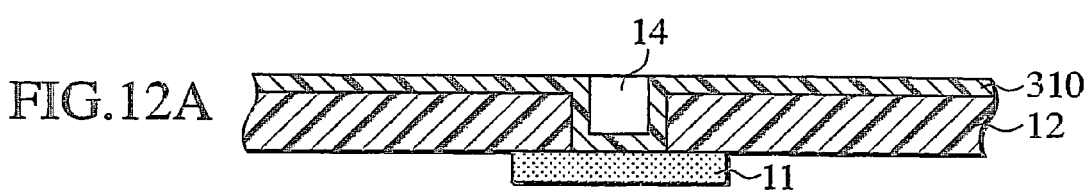
FIGS. 12A through 12E are process drawings showing a second example of the plating technique relating to the second embodiment.
Figure 12B:
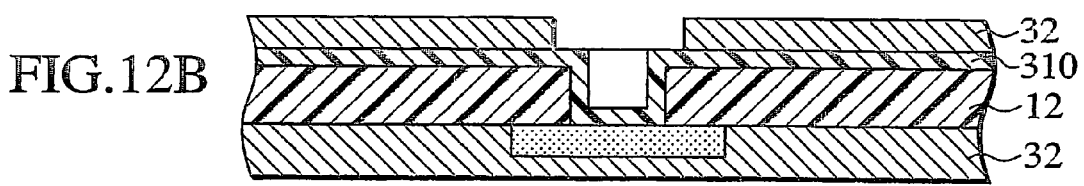
Figure 12C:
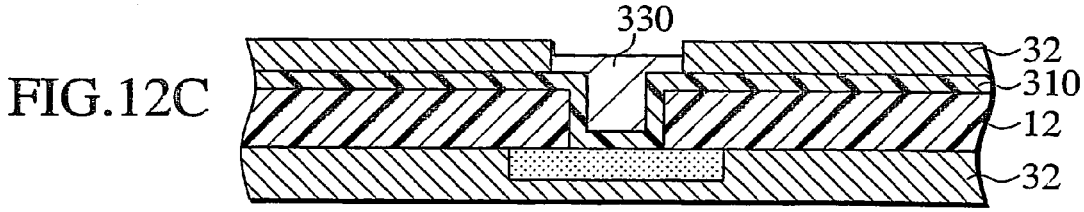
Figure 12D:
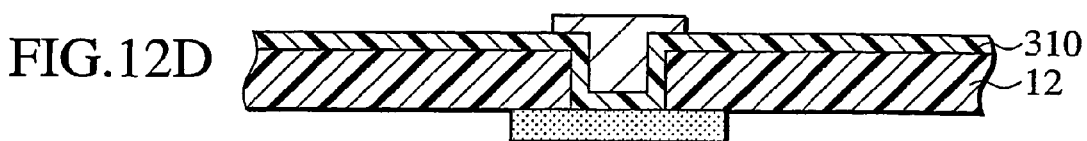
Figure 12E:
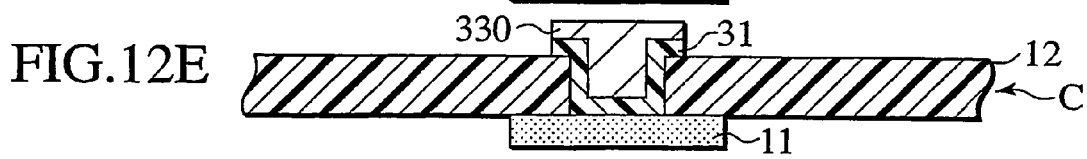

Further, as shown in FIGS. 12A through 12E, the same base material (third surface layer circuitry base material) C can be obtained by the following method, i.e., after the seed layer 310 is formed in the same way as in FIGS. 11A through 11D (FIG. 12A), and the resist 32 is formed so as to be a desired pattern (FIG. 12B), the resist 32 is eliminated due to the copper 330 being deposited at only the region at which the circuitry pattern is needed, by electrolytic plating or the like (FIGS. 12C, 12D), and the seed layer 310 is eliminated by using the copper which was deposited in advance as an etching mask (FIG. 12E).

Figure 13A:
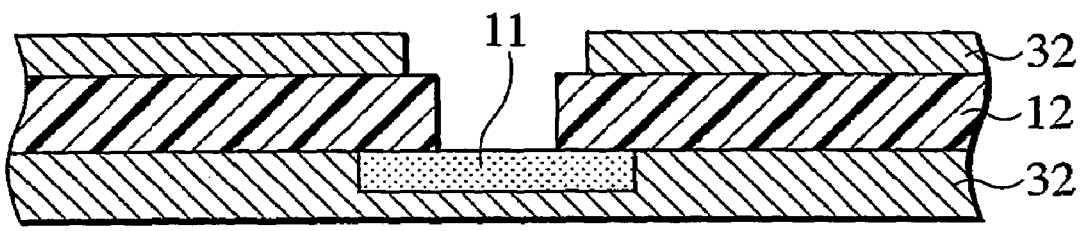
FIGS. 13A through 13C are process drawings showing a third example of the plating technique.
Figure 13B:
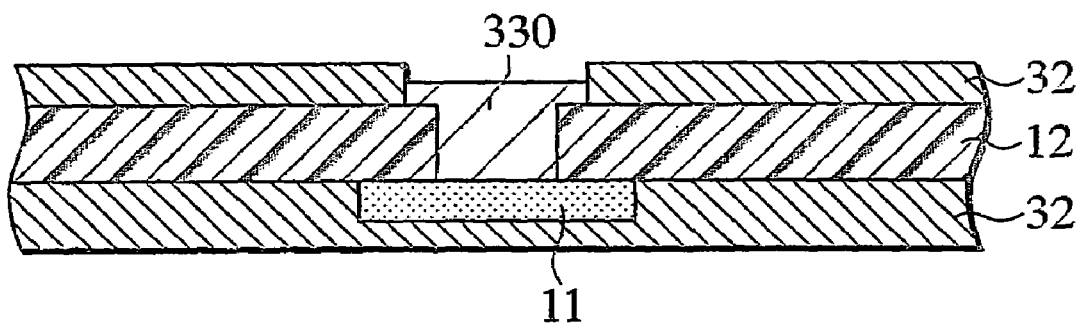
Figure 13C:
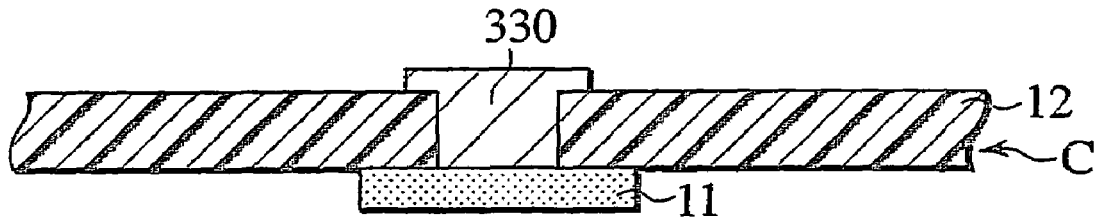

In addition thereto, as shown in FIGS. 13A through 13C, there is a technique in which the resist is formed so as to be a desired pattern without the seed layer 310 being formed (FIG. 13A), and the copper 330 is deposited by electroless chemical copper plating or the like (FIG. 13B), and the resist 32 is eliminated (FIG. 13C).

By using the above-described respective operations, the third surface layer circuitry base material C having the third surface layer interlayer conductive portion in which copper is filled at the inside of the via hole 14 is obtained (3A operation). Note that the thickness of the semiconductor layer formed by plating is preferably about 3 µm through 10 µm, and the diameter of the copper land portion 11 is preferably about 80 µm through 150 µm.

Figure 9E:
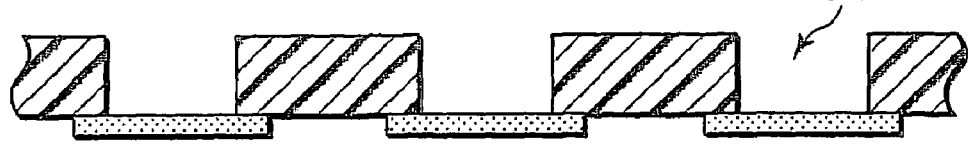

Next, by the techniques which are the same as in the 1A and 2A operations, a third interlayer base material B is obtained in which the copper circuitry and copper land portions 11 are formed at the surface of the insulating layer (an adhesive layer), and the via holes 14 are opened (FIG. 9E) (4A operation). The diameter of the via hole is preferably about 50 µm through 200 µm, and the diameter of the copper land portion is preferably about 250 µm through 400 µm.

Figure 9F:
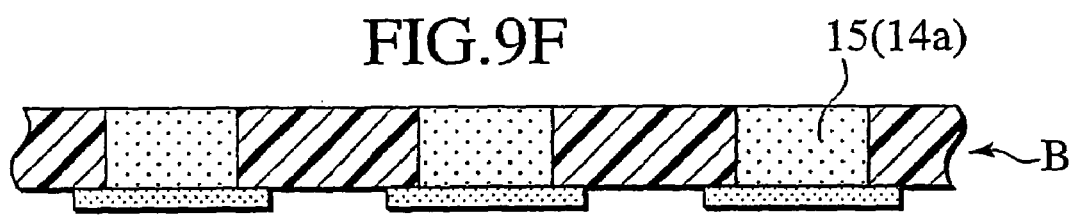

Conductive pastes by using silver, copper, copper coated with silver, or the like as a metal filler are filled at the insides of the via holes 14 of the base material prepared at the 4A operation, by a printing operation or the like, and an interlayer conductive portions 14a are obtained (FIG. 9F) (5A operation).

Figure 9G:
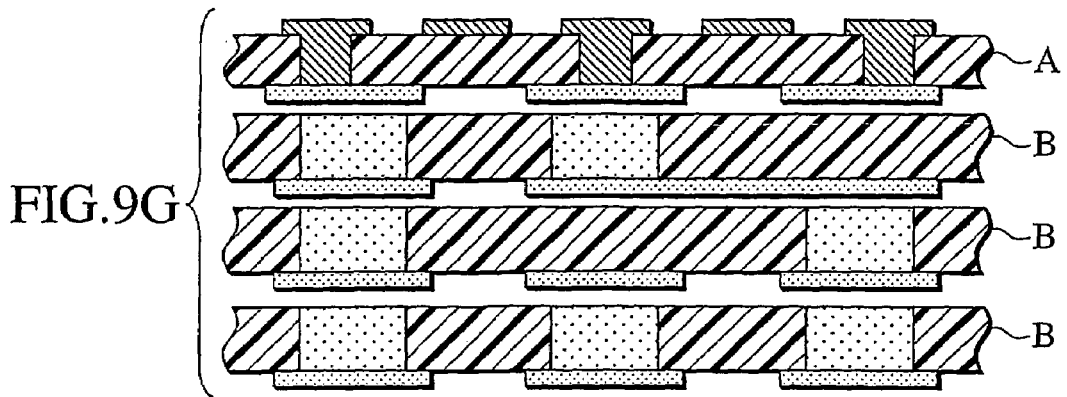

The required number of the third internal layer base materials B obtained at the 4A operation are prepared, the third surface layer circuitry base material A obtained at the 3A operation is disposed such that the side of the minute circuitry obtained by plating is made to be the surface layer, and after positioning is carried out such that the respective interlayer conductive portions and copper land portions are electrically connected by using alignment marks (not shown), reference holes, circuitry patterns or the like which have been provided at the surfaces or the insides of the respective base materials, and thereafter these materials A, B, B, and B are colaminated one another (FIG. 9G). Thereafter, the colaminated board is pressed at 1 through 5 MPa by using a vacuum cure press machine or a cure press machine, and due to the board being heated to 150° C. through 250° C., and being held for 30 minutes through 2 hours, the respective layers A, B, B, and B are fixed to each other (FIG. 9H) (6A operation). As described above, a multi-layer board D having a minute circuitry pattern at the one surface thereof can be easily obtained by using the colaminting operation.

As can be understood from the above description, in the second embodiment, differently from the first embodiment, there is the feature that a plurality of base materials in which a circuitry including at least a board at which a minute circuitry has been formed in advance is prepared as a multi-layer board base material are colaminated one another.

Next, a method for manufacturing a multi-layer wiring substrate relating to a modified example of the second embodiment will be described with reference to FIGS. 14A through 14G In this embodiment, a single-sided copper clad laminate (CCL: Copper Clad Laminate) with a copper foil 23 having an insulating layer 22 (an adhesive layer) (FIG. 14A) is used as a starting material. At 1B operation, fine copper circuitry and copper land portions 21 are formed at the surface on which the copper foil 23 has been formed in advance by using etching or the like (FIG. 14B). As the single-sided CCL at which the minute circuitry is formed by etching, for example, a polyimide, a thermoplastic polyimide, a thermosetting polyimide, a thermoplastic polyimide to which a thermosetting function is provided, or a liquid crystal polymer, or the like is preferably used for an insulating resin layer, and the thickness of the insulating layer is preferably about 10 μm through 70 μm, and the thickness of the copper foil is preferably about 5 μm through 20 μm, and the diameter of the copper land portion is preferably about 80 μm through 150 μm.

Subsequently, at 2B operation, via holes 24 are formed at the insulating layer 22 by laser beam machining, etching, or the like (FIG. 14C). The diameter of the via hole 24 is preferably about 20 μm through 50 μm.

By using the same method of the 3A operation of the above-described second embodiment, third surface layer interlayer conductive portions 24a are formed due to conductor being filled by plating at the insides of the via holes 24 which were prepared at the 2B operation, and copper circuitry portion and copper land portions 26 are formed at the surface opposite to the surface, on which the above-described fine copper circuitry portion and copper land portions 12 are formed, of the insulating layer 22, and the third surface layer circuitry base material E is prepared (FIG. 14D) (3B operation). Note that, the copper circuitry portion and copper land portions 12 which is provided on surface side of the base member E are finer than the copper circuitry portion and copper land portions 26 formed by plating at the other surface side.

Figure 15A:
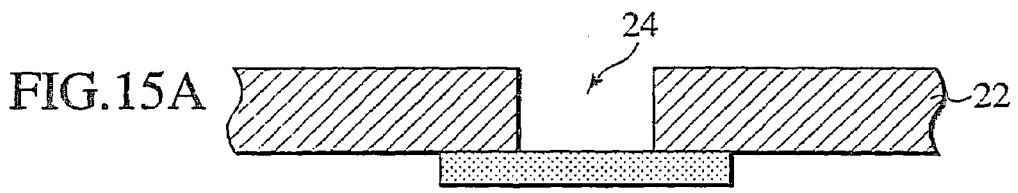
FIGS. 15A through 15C are drawings showing an example of growth of plating at an interlayer conductive portion.
Figure 15B:
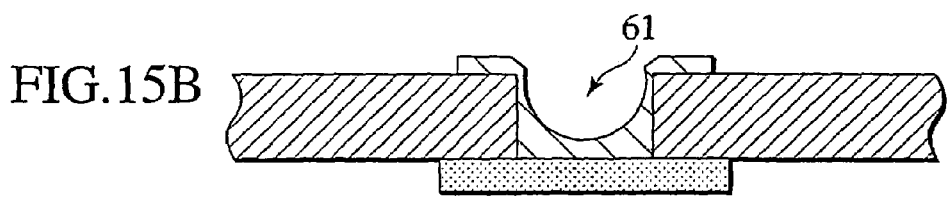
Figure 15C:
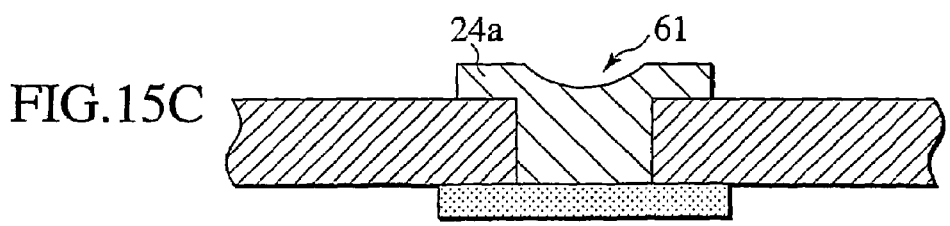

Further, at the 3B operation, with respect to the third surface layer interlayer conductive portions 24a, the via holes 24 are filled by plating. However, as shown in FIGS. 15A through 15C, a depression 61 easily arises directly above the interlayer conductive portion 24a while the plating operation. In consideration of this point, the thickness of the conductive layer formed by plating is preferably about 15 μm through 20 μm. The diameter of the copper land portion 26 at that time is preferably about 250 μm through 400 μm, and is preferably set to be within the tolerance required for the colaminating. In accordance therewith, the multi-layer board in which a minute circuitry is formed at the surface layer at an accuracy of positioning which is the same as in the conventional colaminating can be obtained.

Next, by the techniques which are the same as in the 1A, 2A operations, and the 3A operation of the above-described second embodiment, the third internal layer base material F is formed in which the copper circuitry portion and copper land portions 26 are formed at the one surface of the adhesive insulating layer, and the interlayer conductive portions 27a are formed (FIG. 14E) (4B operation). Note that the diameter of the via hole is preferably within 50 μm through 200 μm, and the diameter of the copper land portion 26 of the third internal layer base material F is preferably within 250 μm through 400 μm.

The required number of the third internal layer base materials F (F1, F2, F3) obtained at the 4B operation are prepared, the third surface layer circuitry base material E obtained at the 3B operation is disposed such that the copper circuitry portion (the surface opposite to the surface on which the minute circuitry is formed) and the copper land portions 26 which were obtained by plating, of the third surface layer circuitry base material E are made to be the internal layer, and after positioning is carried out by using alignment marks (not shown), reference holes, circuitry patterns or the like which have been provided at the surfaces or the insides of the respective base materials, the layers are laminated in a lump and fixed to each other (FIG. 14F). Note that, in FIG. 14F, the third surface layer circuitry base materials F1, F2, F3 each having the different internal circuitry one other are shown. In this way, due to the third surface layer circuitry base materials F each having the different circuitry being formed thereon are used, and therefore it is possible to obtain various multi-layer boards having a desired internal circuitry by combination of these base materials.

After the arrangement, the laminated board is pressed at 1 through 5 Mpa by using a vacuum cure press machine or a cure press machine, and due to the board being heated to 150° C. through 250° C., and being held for 30 minutes through 2 hours, these base materials are colaminated one another (FIG. 13G). In this way, a multi-layer board G having a fine circuitry pattern on the top (uppermost) surface layer thereof can be easily obtained by using the colaminating operation.

Figure 9H:
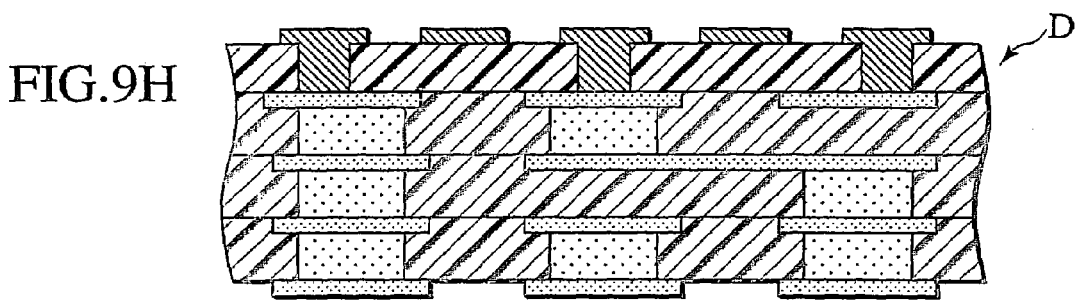

As can be understood by comparison with the multi-layer board D shown in FIG. 9H and the multi-layer board G shown in FIG. 14G, in contrast to the fact that the minute circuitry formed at the top surface layer along with the third surface layer interlayer conductive portions is connected to a semiconductor chip (not shown) or the like at the multi-layer board D, on the other hand the copper lands 21 of the minute circuitry formed at the top surface layer by the above-described 1B operation are connected to the semiconductor chip or the like at the board G.

Figure 16:
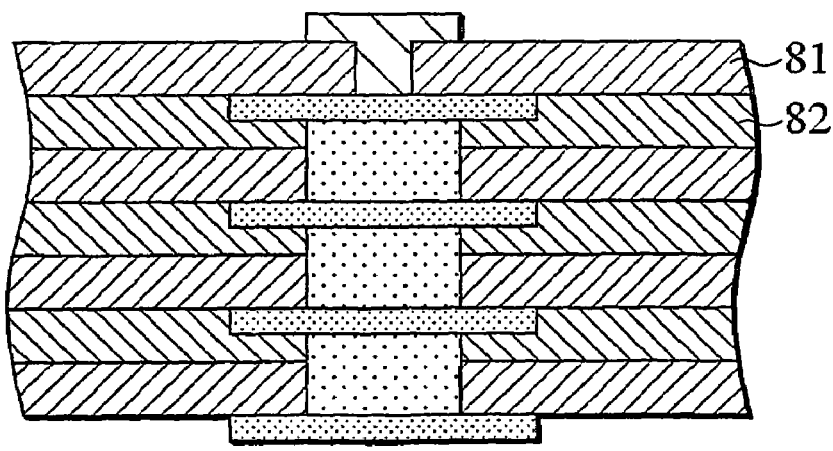
FIG. 16 is a drawing showing another modified example of the second embodiment.

In the second embodiment of the present invention and the modified example of the second embodiment, it is also possible to use a single-sided CCL with a copper foil as a starting member, and after the via holes are opened, a circuitry portion may be formed by using etching or the like. Further, it is not necessarily for using the adhesive insulating layer. Thus, as shown in FIG. 16, a two or more layered structure, which is comprised of an adhesive layer 81 and an insulating layer 82 made from the different member one another, can be used. As an adhesive layer that can be an example at that time, a thermosetting polyimide, a thermoplastic polyimide, a thermoplastic polyimide to which a thermosetting function is provided, or a liquid crystal polymer can also be used.

INDUSTRIAL APPLICABILITY

In accordance with the first embodiment of the present invention, due to the circuitry base material at a surface layer being colaminated along with an internal layer, and only the formation of the circuitry at the top surface layer being carried out after the colaminating, a minute circuitry can be formed without being affected by the accuracy of alignment of the colaminating. Further, a multi-layer board at which semiconductor elements having narrow pitches can be mounted without the advantage of the colaminating in which a high yield can be expected by small man-hour being lost can be provided.

Further, in the second embodiment of the present invention, differently from the first embodiment, the formation of the circuitry can be carried out before the colaminating. In accordance with this method, a multi-layer board in which the fine circuitry pattern on the surface layer is can be formed by the colaminating operation. In accordance therewith, the problems in the related art described above can be solved, and the multi-layer board in which the circuitry pattern is fine can be prepared at a low cost and at a high yield.

Further, at the multi-layer board, there are cases in which some irregularities arise on the surface layer due to the laminated circuitry pattern, and a harmful affect is applied to the formation of the minute circuitry. However, according to a method for manufacturing the multi-layer board relating to the second embodiment, because the irregularity on the surface layer after the lump-sum laminating does not affect, a circuitry which is even finer than that of the first embodiment described above can be formed.

The invention claimed is:

1. A manufacturing method of a multi-layer board, the method comprising: forming at least a first internal layer base material which has a conductive circuitry at one side surface of an insulating layer and which has an interlayer conductive portion for electrically connecting the conductive circuitry and other side surface of the insulating layer; forming a second internal layer base material having a conductive circuitry at one side surface of an insulating layer;

colaminating the first internal layer base material and the second internal layer base material to electrically connect the interlayer conductive portion of the first internal layer base material and the conductive circuitry of the second internal layer base material to one another;

subsequently forming a second interlayer conductive portion at the insulating layer of the second internal layer base material in order to electrically connect the conductive circuitry formed at the one side surface of the second internal layer base material and the other side surface of the second internal layer base material; and forming minute circuitry at the other side surface of the second internal layer base material, wherein the minute circuitry is finer than the conductive circuitries of the first and second internal base layer materials.

2. The manufacturing method according to claim 1, wherein the operation of forming the minute circuitry includes processing a conductive foil which is previously formed on the other side surface of the second internal layer base material by the colaminating.

3. The manufacturing method of a multi-layer board according to any one of claims 1 and 2, wherein the insulating layer of the insulating base material and the insulating layer of the first internal layer base material are made from a same material.

4. The manufacturing method of a multi-layer board according to claim 3, wherein at least a part of the insulating layer of the insulating base material and the first internal layer base material are made from an adhesive material.

5. The manufacturing method of a multi-layer board according to claim 3, wherein the insulating layer is made from one of a polyimide, a thermoplastic polyimide, a thermosetting polyimide, a thermoplastic polyimide to which a thermosetting resin is provided, or a liquid crystal polymer.

6. The manufacturing method of a multi-layer board according to any one of claims 1 and 2, further includes a step of positioning which positions the interlayer conductive portions and the conductive circuitry portions one another by X-rays.

* * * * *